United States Patent
Blazek et al.

[11] Patent Number: 6,158,339
[45] Date of Patent: Dec. 12, 2000

[54] STENCIL HOLDER ASSEMBLY FOR USE WITH SOLDER PASTE STENCIL PRINTERS

[75] Inventors: John W. Blazek, San Jose; James G. Vaughn, Sunnyvale, both of Calif.

[73] Assignee: Alpha Metals, Inc., Jersey City, N.J.

[21] Appl. No.: 09/240,517

[22] Filed: Jan. 29, 1999

[51] Int. Cl.[7] .................................................. B41F 15/34
[52] U.S. Cl. ..................................... 101/127.1; 101/128.1
[58] Field of Search .............................. 101/127, 127.1, 101/128.1, 129

[56] References Cited

U.S. PATENT DOCUMENTS

| | | | |
|---|---|---|---|
| 3,221,647 | 12/1965 | Carlsen | 101/127.1 |
| 4,314,503 | 2/1982 | Perra, Jr. et al. | 101/127.1 |
| 5,107,759 | 4/1992 | Omori et al. | 101/127.1 |
| 5,317,967 | 6/1994 | Heidenreich | 101/127.1 |
| 5,704,287 | 1/1998 | Omori et al. | 101/127.1 |
| 5,755,157 | 5/1998 | Omori et al. | 101/126 |

FOREIGN PATENT DOCUMENTS

| | | | |
|---|---|---|---|
| 84962 | 7/1981 | Japan | 101/127 |
| 314580 | 11/1992 | Japan | 101/127.1 |
| 2031340 | 4/1980 | United Kingdom | 101/127 |

*Primary Examiner*—Stephen R. Funk
*Attorney, Agent, or Firm*—Mintz, Levin, Cohn, Ferris, Glovsky and Popeo, P.C.

[57] ABSTRACT

A stencil holder assembly comprising a stencil plate connector and a stencil plate for use with a stencil printer in single component solder paste applications. The stencil plate connector is mounted onto the stencil printer for the duration of operation of the stencil printer and stencil plates are removably mounted thereon by means of an adapter centrally mounted on the stencil plate. Solder paste stencil patterns are readily interchanged onto the stencil printer during solder paste applications by mounting and removing stencil plates from the stencil plate connector.

11 Claims, 5 Drawing Sheets

STENCIL HOLDER ASSEMBLY FOR USE WITH SOLDER PASTE STENCIL PRINTERS

FIELD OF THE INVENTION

The present invention provides a stencil holder assembly for use with a stencil printer designed for single component solder paste application onto a printed circuit board.

BACKGROUND OF THE INVENTION

In certain electronic printed circuit board production situations, such as rework, repair, prototyping and research and development, it is often necessary to replace or exchange single components on populated printed circuit boards. Techniques for replacing components often involve applying solder paste, solder paste beads, solder tape or solder dots onto substrate pads on a circuit board for subsequent mounting of a new component onto the printed circuit board. In some instances, new solder is applied to existing solder on the printed circuit board on which a new component is mounted. The disadvantages of such single component placement techniques include placement inaccuracy, contamination, and inconsistent paste volume from pad to pad which can result in bridging problems and poor solder joints.

Prior art solutions to single component solder paste application techniques include the use of solder paste stencil printers such as those disclosed in U.S. Pat. Nos. 5,107,759 and 5,755,157, incorporated herein by reference. Such solder paste stencil printers are one-at-a-time, hand-operated stencil printers that provide a simple, accurate and consistent apparatus and method of stencil printing.

A variety of stencil patterns can be used with the hand-held stencil printer 10 shown in FIG. 1 by changing the stencil holder 17 that slips onto a mounting shaft 18 attached to the pivot arm assembly 11. As shown in FIG. 2, a stencil holder 21, as disclosed in U.S. Pat. No. 5,107,759 and U.S. Pat. No. 7,755,175, typically includes a cylindrical holder 22 and a stencil plate 23. The cylindrical holder 22 fits over the mounting shaft 18. The stencil plate 23 is disclosed as being permanently bonded to the cylindrical holder 22 to comprise the stencil holder 21. This is achieved by bonding the stencil plate 23 with adhesive to a conforming pad 25 that is bonded to a step washer 24 attached to the cylindrical holder 22. The conforming pad 25 and the step washer 24 each include a centrally-located aperture 27. Commercially available stencil holders as shown in FIG. 2 include stencil plates centrally-mounted to cylindrical holders, as described in U.S. Pat. No. 5,107,759, and flip-up stencil shovels side-mounted to cylindrical holders, as described in U.S. Pat. No. 5,704,287.

A variety of stencil patterns corresponding to a variety of circuit board patterns can be interchanged for use with the hand-held stencil printer 10. However, only a single stencil plate with a set configuration of apertures or footprint pattern can be used to print a specific solder pattern onto a printed circuit board. With the large number and variety of integrated circuits and electronic components available today, one must acquire a large number of stencil holders, one for each type of integrated circuit or electronic component to be soldered onto circuit boards. Therefore, a large number of stencil holders must be stocked in order to accommodate the large number and variety of stencil patterns required. Stencil holders, as shown in FIG. 2, are commercially available as single units, requiring the purchase of both the cylindrical holder 22 and the stencil plate 23 when only a change in stencil plate or pattern is required.

SUMMARY OF THE INVENTION

Embodiments of the present invention provide a stencil holder assembly for single component solder paste application with a stencil printer that achieves greater economy in the use and replacement of a large number and variety of stencil patterns, and allows stencil patterns to be interchanged more simply and quickly.

In one general aspect, the invention provides a stencil holder assembly for use with a hand-held stencil printer that includes a hollow, cylindrical stencil plate connector and a stencil plate with a plurality of apertures. The cylindrical stencil plate connector has a longitudinal, interior shaft with a diameter sized to permit one end of the stencil plate connector to fit over the mounting shaft of a stencil printer. The opposite end of the stencil plate connector is configured as a detent to accept the stencil plate. The stencil plate has a centrally-mounted resilient O-ring sized to fit into the detent of the cylindrical stencil connector. The stencil plate is mounted onto the stencil plate connector by coupling the O-ring and the detent, and remains attached to the stencil plate connector until such coupling is manually broken. Stencil patterns can be changed simply by removing and replacing stencil plates from the stencil plate connector permanently mounted onto the stencil printer for the duration of operation.

BRIEF DESCRIPTION OF THE DRAWINGS

For a better understanding of the present invention, reference is made to the drawings which are incorporated herein by reference and in which.

DETAILED DESCRIPTION OF THE INVENTION

Illustrative embodiments of the present invention described below are directed to a stencil holder assembly for use with stencil printers, including hand-held stencil printers, for single component solder paste applications.

Figure 3:
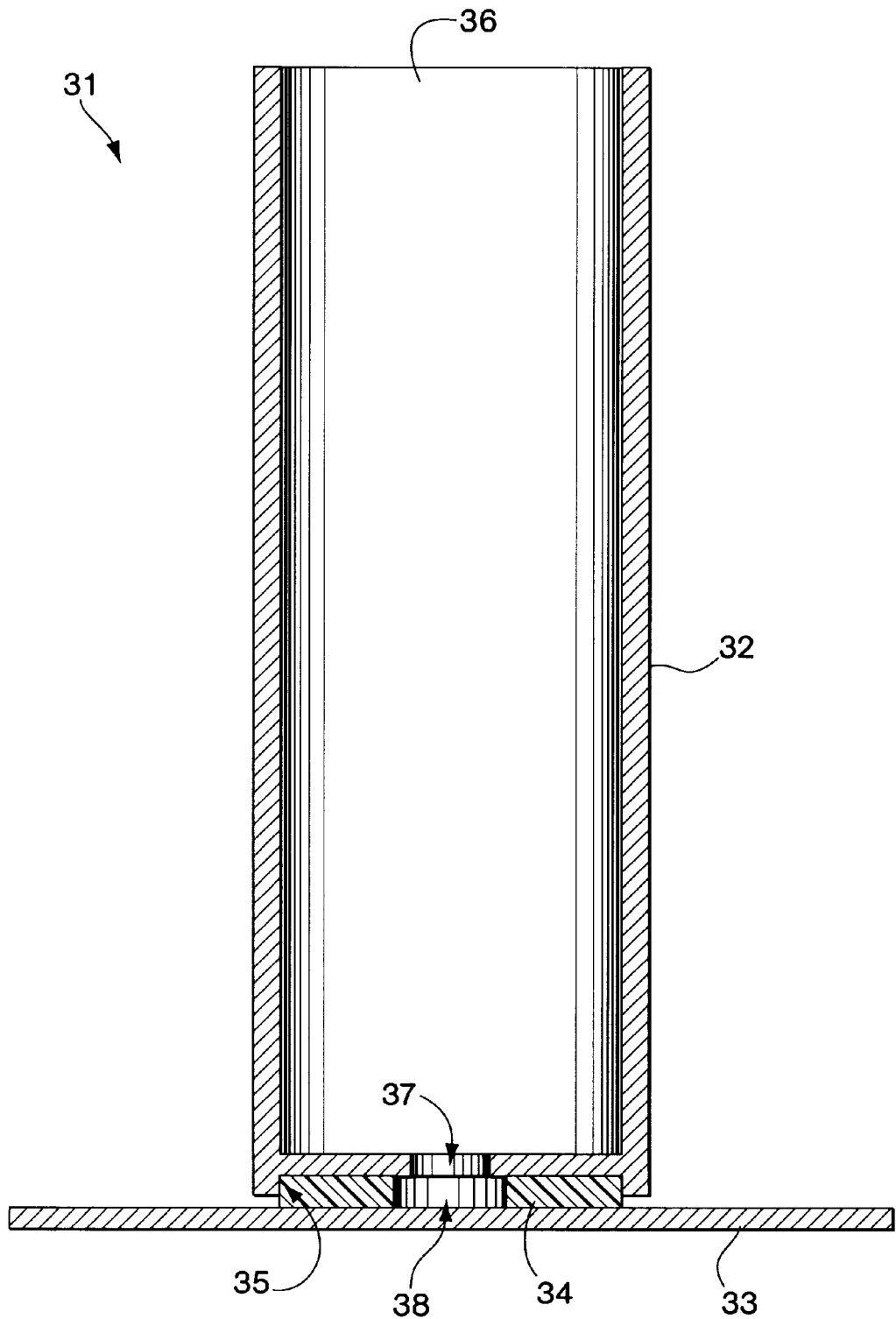
FIG. 3 is a cross section of a stencil holder assembly of the present invention comprising a hollow, cylindrical stencil plate connector and a stencil plate.

Embodiments of the present invention will now be described with reference to FIGS. 3–8. FIG. 3 shows one embodiment of a stencil holder assembly 31. The stencil holder assembly 31 includes a hollow, cylindrical stencil plate connector 32 and a stencil plate 33 mounted on the stencil plate connector 32 by means of a resilient O-ring 34 centrally mounted on the stencil plate 33. The cylindrical stencil plate connector 32 features one end configured as a detent 35 to receive the O-ring 34 centrally mounted on the stencil plate 33. The coupling of the stencil plate connector 32 with the stencil plate 33 is achieved by the pressure created from insertion of the O-ring 34 of the stencil plate 33 into the detent 35 of the stencil plate connector 32. The stencil plate 33 remains attached to the stencil plate connector 32 until such time as the coupling achieved by placement of the O-ring 34 into the detent 35 is manually broken by removal of the stencil plate 33 from the stencil plate connector 32.

Figure 1:
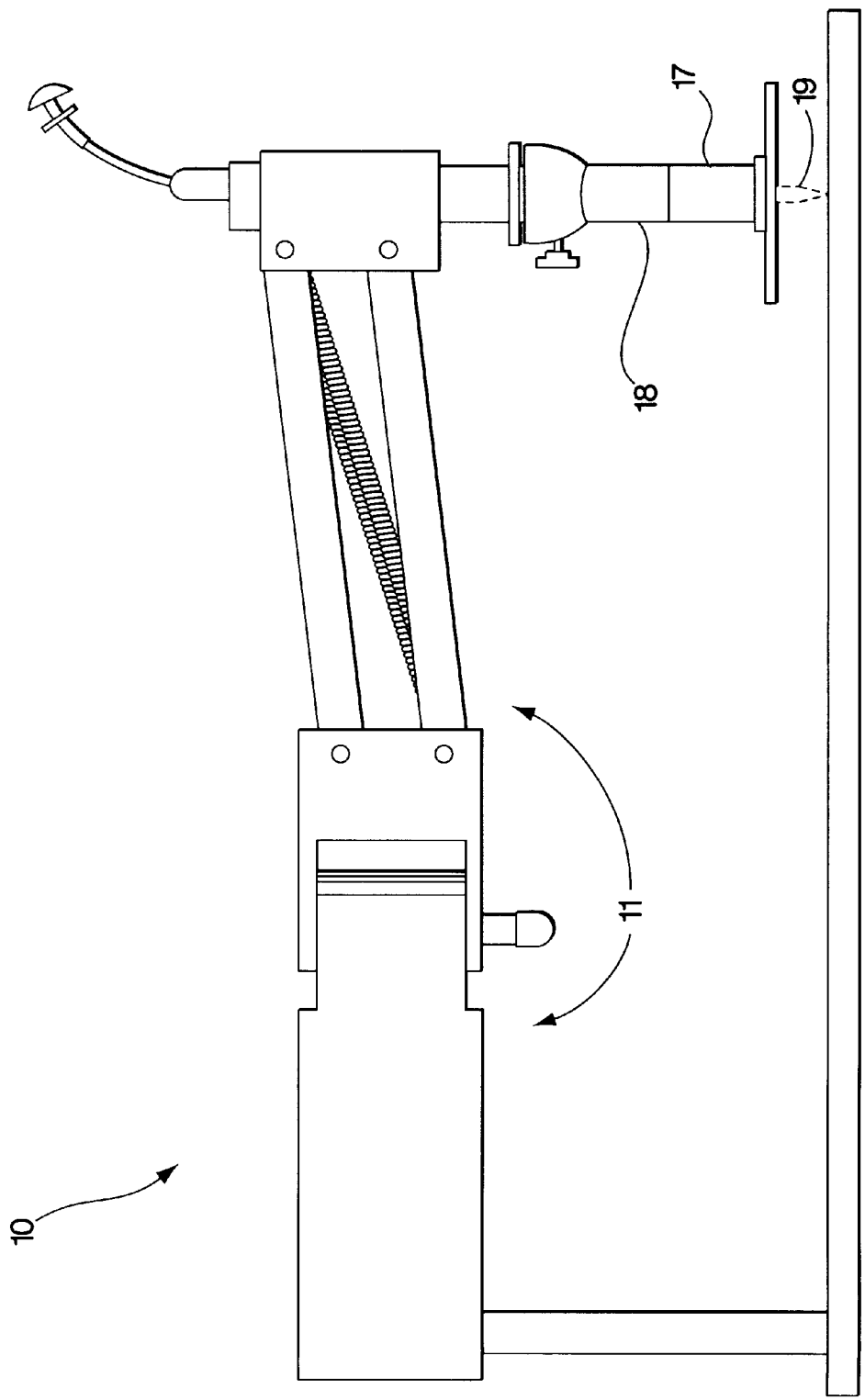
FIG. 1 shows a hand-held prior art screen printer as described in U.S. Pat. Nos. 5,107,759 and 5,755,157.
Figure 2:
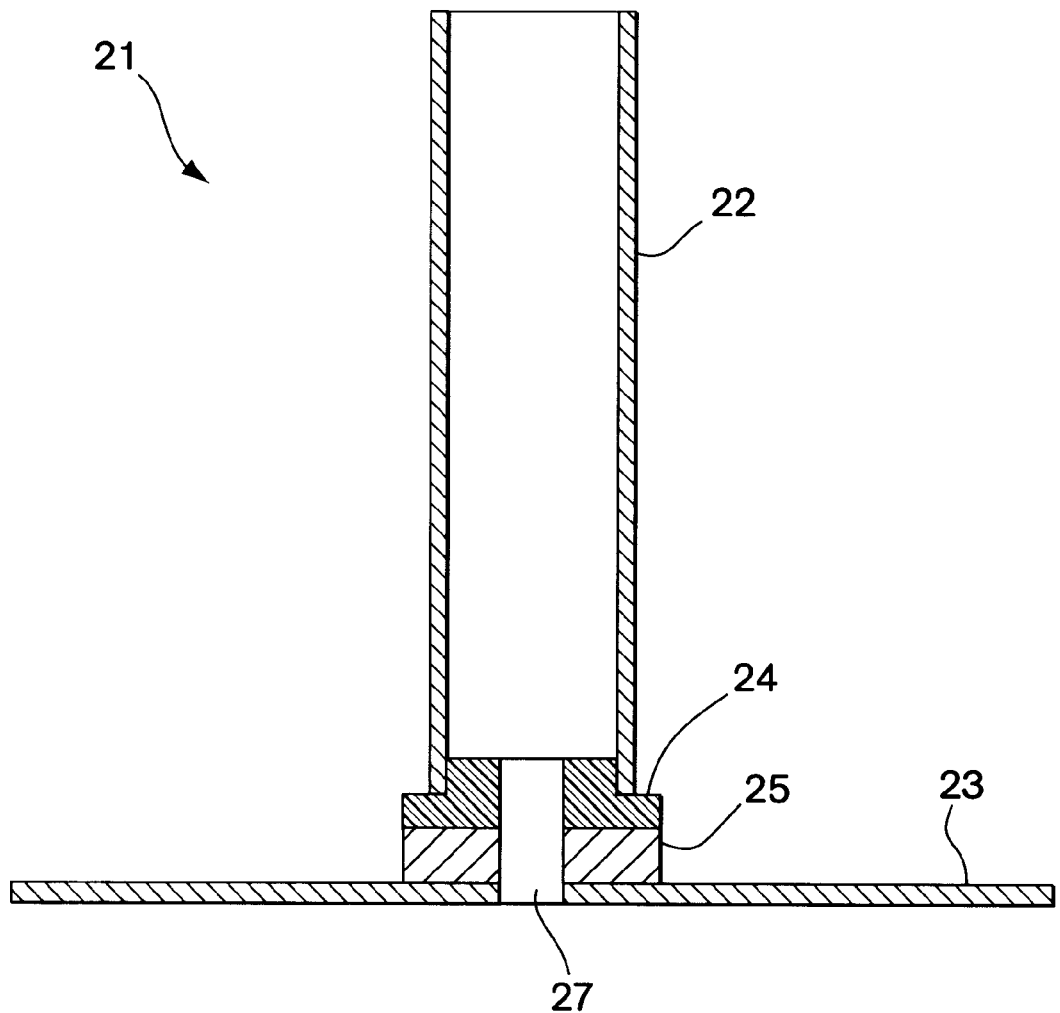
FIG. 2 is a cross section of a prior art stencil holder described in U.S. Pat. Nos. 5,107,759 and 5,755,157.

Referring to FIGS. 1 and 3, the stencil plate connector 32 has an open end 36 opposite the end having the detent 35. The open end 36 has a diameter sized to fit over the mounting shaft 18 of the hand-held stencil printer 10 shown in FIG. 1. The stencil plate connector 32 is mounted onto the stencil printer 10 by slipping the open end 36 over the mounting shaft 18. The stencil plate 33 is subsequently mounted onto the stencil plate connector 32 by inserting the O-ring 34 of the stencil plate 33 into the detent 35 of the stencil plate connector 32.

The detent 35 of the stencil plate connector 32 contains a central aperture 37. In addition, the stencil plate 33 also contains a central aperture 38. When the stencil plate 33 is mounted onto the stencil plate connector 32, the central aperture 37 of the detent 35 and the central aperture 38 of the stencil plate 33 are in alignment to accept a lifting rod 19 located and centrally guided in the mounting shaft 18 of the stencil printer 10. The lifting rod 19 is activated subsequent to solder paste application to remove the stencil plate from the substrate by a lifting action. The lifting rod 19 is moved downward through the central aperture 37 of the detent 35 and through the central aperture 38 of the stencil plate 33 into the position shown in FIG. 1, contacting the substrate surface and forcing the mounting shaft 18 and the attached stencil plate connector 32 and stencil plate 33 upward. The stencil plate 33 is removed from the substrate and can be removed from the stencil plate connector 32. The stencil plate connector 32 is now ready to accept another stencil plate for the same or different solder paste application.

Figure 4:
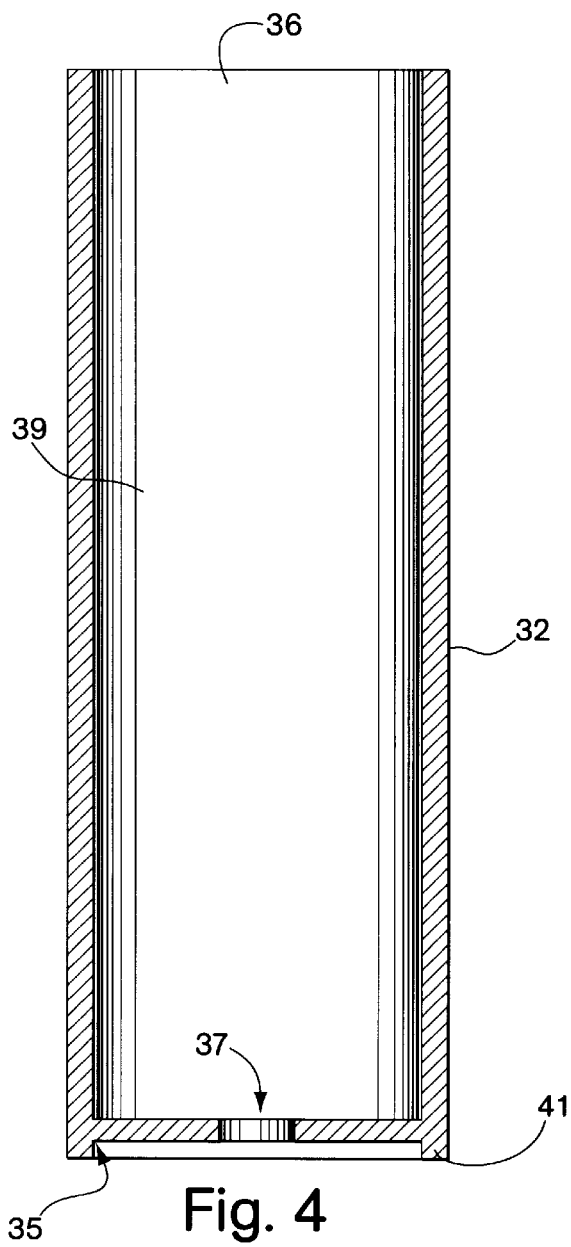
FIG. 4 is a cross section of a hollow, cylindrical stencil plate connector.

FIG. 4 shows the hollow, cylindrical stencil plate connector 32 portion of the stencil holder assembly 31. The cylindrical stencil plate connector 32 has a longitudinal, interior shaft 39 with an internal diameter sized to permit one end 36 of the stencil plate connector 32 to fit over the mounting shaft 18 of the hand-held stencil printer 10. As discussed above, the opposite end of the stencil plate connector 41 is configured as a detent 35 to receive the O-ring 34 centrally mounted on the stencil plate 33. The detent 35 has a central aperture 37 to allow passage of the lifting rod 19 of the hand-held stencil printer 10 through the stencil plate connector 32 for lifting the stencil plate connector 32 from the substrate after solder paste application.

Figure 5:
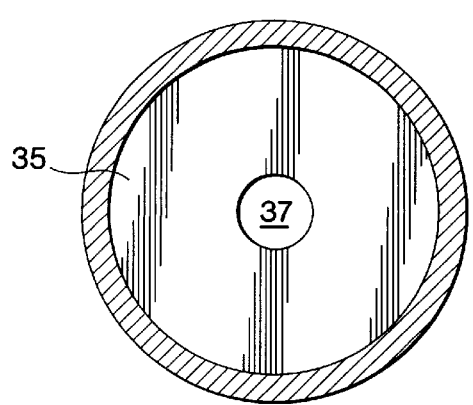
FIG. 5 is an end view of a hollow, cylindrical stencil plate connector featuring a detent with a central aperture.

FIG. 5 shows an end view of the detent 35 with the central aperture 37.

Figure 6:
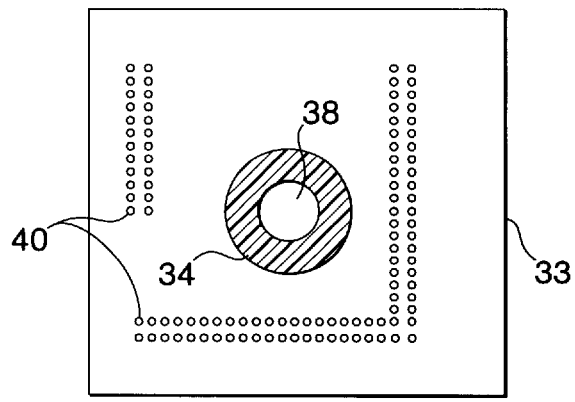
FIG. 6 is a top view of a stencil plate with a plurality of apertures and a centrally mounted O-ring with a central aperture.

As shown in FIG. 6, the stencil plate 33 includes a plurality of apertures 40 conforming to a pattern of solder paste to be printed on a substrate. Once mounted onto the stencil plate connector 32, the stencil plate 33 is placed on the surface of the substrate and solder paste is passed over the surface of the stencil plate 33 and forced through the apertures to form the pattern of solder paste on the substrate. The O-ring 34 features a central aperture 38 to allow passage of the lifting rod 19 of the hand-held stencil printer 10 through the stencil plate 33 to lift the stencil plate 33 off of the substrate after solder paste application.

Figure 7:
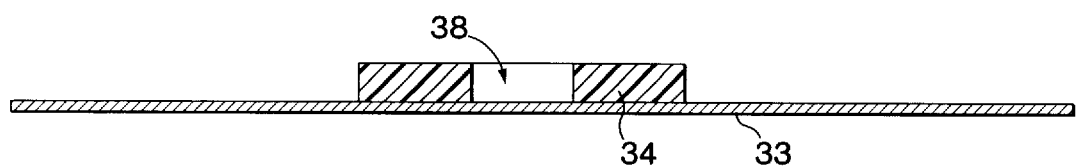
FIG. 7 is a cross section of a stencil plate with a centrally mounted, O-ring with a central aperture.
Figure 8:
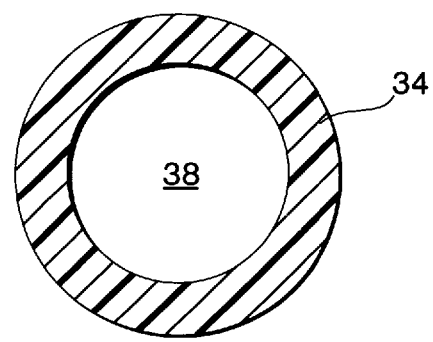
FIG. 8 is an end view of a O-ring with a central aperture.

FIG. 7 is a cross section of the stencil plate 33 with an O-ring 34 centrally mounted thereon. In one embodiment, the O-ring is constructed of a resilient material to provide flexibility in the horizontal plane alignment of the stencil plate on the surface of the substrate, thereby accommodating any minor imperfections and irregularities of the substrate surface and accounting for variations in printed circuit board placement and rod alignment.

Embodiments of the present invention provide a more economical apparatus and method that allows stencil patterns for single component solder paste application to be changed more quickly and simply. In embodiments of the invention, the stencil plate mounted on a stencil printer is replaced when it is desired to change a solder paste stencil pattern, rather than changing the cylindrical holder 22 and the stencil plate 23. Interchanging the stencil plate to change solder paste stencil patterns rather than interchanging the stencil holder eliminates the cost of purchasing multiple cylindrical holders.

In addition, interchanging solder paste stencil patterns simply by removing and mounting stencil plates onto a stencil plate connector permanently mounted to the stencil printer throughout the duration of operation permits a large number and variety of stencil patterns to be printed on substrates more simply and quickly.

As understood by those skilled in the art, stencil holder assemblies, in accordance with the embodiments of the present invention, are not limited for use in solder paste applications, but rather, can be used in the application of other materials such as adhesives, other metal pastes, pigments, etc. to circuit boards or other substrates.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A stencil holder assembly for applying solder paste to a substrate using a stencil printer having a mounting shaft, the stencil holder assembly comprising:

a stencil plate connector that fits over the mounting shaft of the stencil printer and couples to a stencil plate;

a stencil plate with a plurality of apertures conforming to a footprint pattern, the stencil plate being removably coupled to a first end of the stencil plate connector; and an adapter, centrally mounted on the stencil plate, that removably couples the stencil plate to the stencil plate connector.

2. The stencil holder assembly of claim 1, wherein the stencil plate connector includes:

a shaft extending longitudinally from a second opposing end of the stencil plate connector to the first end of the stencil plate connector and having an interior diameter sized to fit over the mounting shaft of the stencil printer; and a detent at the first end of the shaft, the detent being constructed and arranged to receive the adapter.

3. The stencil holder assembly of claim 2, wherein the shaft is hollow and cylindrical.

4. The stencil holder assembly of claim 2, wherein the detent includes:

a center aperture.

5. The stencil holder assembly of claim 2, wherein the stencil plate connector is hollow and cylindrical.

6. The stencil holder assembly of claim 1, wherein the stencil plate connector is hollow and cylindrical.

7. The stencil holder assembly of claim 1, wherein the adapter includes:

a center aperture.

8. The stencil holder assembly of claim 1, wherein the adapter comprises:

a resilient O-ring.

9. A method of printing a first solder paste pattern on a first substrate and a second solder paste pattern on a second substrate using a stencil printer, the method comprising steps of:

mounting a stencil plate connector onto the stencil printer, wherein the stencil plate connector has a shaft extending from a first end of the stencil plate connector to a second end of the stencil plate connector, and wherein the step of mounting the stencil plate connector onto the stencil printer includes mounting the shaft onto the stencil printer such that the first end of the stencil plate connector fits over a mounting shaft of the stencil printer;

mounting a first stencil plate having a plurality of apertures conforming to the first solder paste pattern onto the stencil plate connector;

printing the first solder paste pattern on the first substrate whereby solder paste is forced through the apertures onto the first substrate;

removing the first stencil plate from the stencil plate connector;

mounting a second stencil plate having a plurality of apertures conforming to the second solder paste pattern onto the stencil plate connector; and printing the second solder paste pattern on the second substrate whereby solder paste is forced through the apertures onto the second substrate, wherein the step of mounting the first stencil plate and the step of mounting the second stencil plate onto the stencil printer include inserting an adapter, centrally mounted on each of the first and the second stencil plates, into the second end of the stencil plate connector, and wherein the step of inserting the adapter into the second end of the stencil plate connector includes inserting a resilient O-ring into the second end of the stencil plate connector.

10. The method of claim 9, wherein the step of removing the first stencil plate and the step of removing the second stencil plate from the stencil connector includes:

removing the adapter from the second end of the stencil connector.

11. The method of claim 9, wherein the step of inserting the O-ring into the second end of the stencil plate connector includes:

receiving the O-ring by a detent at the second end of the stencil plate connector.

* * * * *